United States Patent [19]

Cho et al.

[11] Patent Number: 5,229,333
[45] Date of Patent: Jul. 20, 1993

[54] METHOD FOR IMPROVING THE INTERFACE CHARACTERISTICS OF $CaF_2$ ON SILICON

[75] Inventors: Chih-Chen Cho, Richardson; Tae S. Kim, Dallas; Bruce E. Gnade, Rowlett, all of Tex.; Yasushiro Nishioka, Tsukuba, Japan; Hung-Yu Liu, Richardson, Tex.

[73] Assignee: Texas Instruments Incorporated, Dallas, Tex.

[21] Appl. No.: 843,038

[22] Filed: Feb. 28, 1992

[51] Int. Cl.$^5$ .............................................. H01L 21/02
[52] U.S. Cl. .................................... 437/235; 156/610; 156/613; 156/DIG. 73; 156/DIG. 103
[58] Field of Search ............... 156/610, 613, DIG. 73, 156/DIG. 103; 437/235

[56] References Cited

PUBLICATIONS

C.-C. Cho, et al., "Substrate Orientation and Processing Effects on Strained $CaF_2$/Si Grown by Molecular Beam Epitaxy", *The Japan Society of Applied Physics*, Reprinted from Extended Abstracts of the 22nd Conference on Solid State Devices and Materials, pp. 1167–1168, Aug. 22–24, 1990.
C.-C. Cho, et al., "Electrical Properties of Low-Temperature-Grown $CaF_2$ on Si(111)", *Applied Physics Letter*, pp. 338–340, 60 (3), Jan. 20, 1992.
R. W. Fathauer, et al., "MIS Characterization and Modeling of the Electrical Properties of the Epitaxial $CaF_2$/Si(111) Interface", *Journal of Electronic Materials*, pp. 169–175, vol. 16, No. 3, 1987.
R. People, et al., "Electrical Characterization of the $CaF_2$/Si-Epitaxial Insulator/Semiconductor Interface by MIS Admittance", *Materials Research Society Symposium Proceedings*, pp. 169–173, vol. 37, 1985.
T. P. Smith, III, et al., "The Electronic Properties of Epitaxial Calcium Fluoride-Silicon Structures", *Materials Research Society Symposium Proceedings*, pp. 295–305, vol. 54, 1986.
H. Y. Liu, et al., "A Study of Epitaxial Relations of $CaF_2$Films Grown on (111) Silicon by Molecular Beam Epitaxy", *Mat. Res. Soc. Symp. Proc.*, pp. 111–116, vol. 221, 1991.

*Primary Examiner*—Robert Kunemund
*Assistant Examiner*—Felisa Garrett
*Attorney, Agent, or Firm*—Michael K. Skrehot; James C. Kesterson; Richard L. Donaldson

[57] ABSTRACT

In one form of the invention, a method is disclosed for growing $CaF_2$ on a silicon surface, comprising the steps of maintaining the silicon surface at a first temperature below approximately 500° C., starting a deposition of $CaF_2$ on the silicon surface, stopping the deposition, and then annealing the $CaF_2$ in forming gas at a temperature below 600° C.

20 Claims, 2 Drawing Sheets

1

METHOD FOR IMPROVING THE INTERFACE CHARACTERISTICS OF CAF₂ ON SILICON

FIELD OF THE INVENTION

This invention generally relates to the improvement of interface quality of $CaF_2$ on silicon.

BACKGROUND OF THE INVENTION

Without limiting the scope of the invention, its background is described in connection with semiconductor devices, as an example.

Heretofore, in this field, the epitaxial growth of insulators on semiconductors has been an important step in the fabrication of various electronic devices, such as metal-insulator-semiconductor field effect transistors (MISFETs), silicon on insulator (SOI) technology, three dimensional integrated circuits, etc., as well as novel devices that cannot be achieved with amorphous insulators. Epitaxial growth of Group II fluoride on silicon has been studied extensively because of its technological and scientific interest. As one of the most promising candidates in this area, the $CaF_2$/Si couple has attracted considerable attention. From a materials preparation point of view, $CaF_2$ is a relevant choice among the fluorides for deposition on silicon because it fits several important criteria for a good epitaxial system, i.e. small lattice mismatch and similar cubic structure. Previous studies have shown that the chemical and structural properties of the $CaF_2$/Si interface vary under different deposition conditions and that these variations can significantly change the electrical characteristics of a system incorporating this interface.

In the past, epitaxial $CaF_2$ films have been grown by molecular beam epitaxy (MBE) with substrates held at a fixed temperature from 500° C. to 800° C. Many state-of-the-art characterization techniques, including high-resolution transmission electron microscopy (HRTEM), medium energy ion scattering (MEIS), x-ray photoemission spectroscopy (XPS) and x-ray standing wave (XSW), have been applied in the past to understand the interface structure between $CaF_2$ and Si. The exact atomic model governing the initial stage of epitaxial growth is still widely disputed. In co-assigned patent application Ser. No. 07/704,535, a method is described that allows the growth of A-type films, i.e. the orientation of the $CaF_2$ film is identical to the Si substrate.

One of the problems faced has been the poor interface quality between the $CaF_2$ and Si surfaces, in particular, the presence of a high level of interface charge density.

SUMMARY OF THE INVENTION

It is herein recognized that a need exists for a method of reducing the interface charge density between a silicon surface and $CaF_2$ film. The present invention is directed toward meeting those needs.

Generally, and in one form of the invention, a method is disclosed for the growth of $CaF_2$ on a silicon surface, comprising the steps of maintaining the silicon surface at a substantially fixed temperature below approximately 500° C., depositing $CaF_2$ on the surface, and then annealing the $CaF_2$ in a reducing gas at a temperature at or below 600° C.

In another form of the invention, a method is disclosed for growing $CaF_2$ on a silicon surface, comprising the steps of maintaining the silicon surface at a first temperature below approximately 500° C., starting deposition of $CaF_2$ on the silicon surface, ramping the first temperature to a second temperature over a first time period, maintaining the second temperature until the $CaF_2$ has deposited to a desired thickness, stopping the deposition, and then annealing the $CaF_2$ in a reducing gas at a temperature at or below 600° C.

In yet another form of the invention, a method is disclosed for the growth of $CaF_2$ on a silicon surface, comprising the steps of maintaining the silicon surface at a substantially fixed temperature above approximately 500° C., depositing $CaF_2$ on the surface, and then annealing the $CaF_2$ in a reducing gas at a temperature at or below 600° C.

BRIEF DESCRIPTION OF THE DRAWINGS

The foregoing and further aspects of the invention are illustrated in the accompanying drawings wherein like elements are denoted by like reference designators and in which.

DETAILED DESCRIPTION OF PREFERRED EMBODIMENTS

Figure 1:
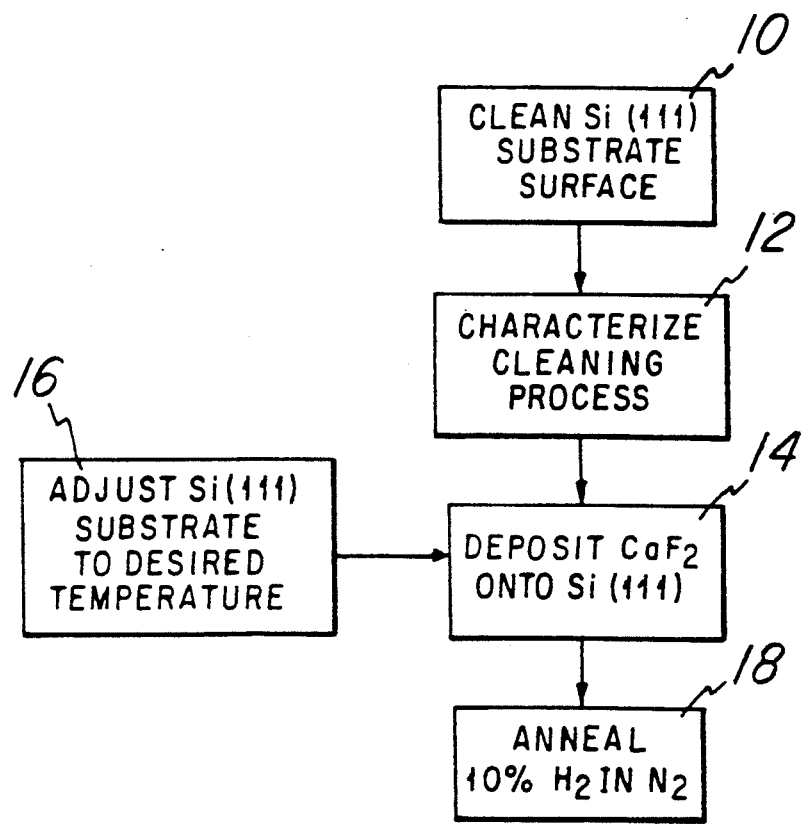
FIG. 1 is a process flow diagram of the first preferred embodiment method of the invention.
Figure 2:
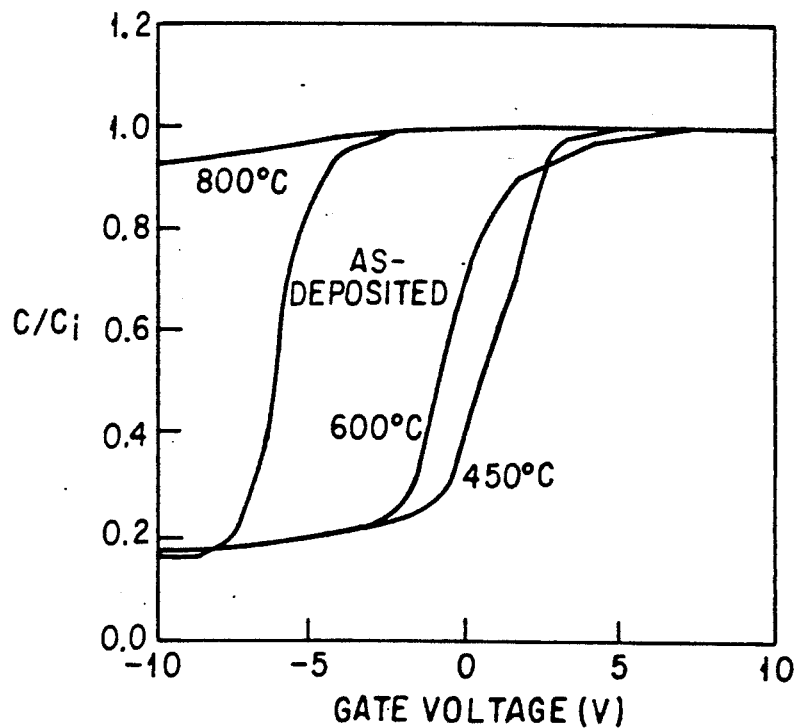
FIG. 2 is a plot of the capacitance-voltage characteristics of capacitors fabricated using $CaF_2$ deposited on silicon at 400° C.

In a first preferred embodiment process of the present invention, A-type $CaF_2$ films were epitaxially deposited onto (111)Si substrates according to the process flow of FIG. 1. A (111)Si substrate is cleaned in step 10 prior to $CaF_2$ deposition by annealing the substrate in an MBE chamber at 950° C. for 10 minutes, plus another 10 minutes with a Si flux equivalent to a deposition rate of 0.01 monolayer/sec, for example. In step 12, reflection high-energy electron diffraction (RHEED) and Auger spectroscopy, for example, are used to characterize the cleaning process. In step 14, $CaF_2$ is deposited onto the (111)Si substrate surface by molecular beam epitaxy (MBE) from an effusion cell with a deposition rate of 4 nm/min and to a film thickness of 100 nm. As shown in step 16, the temperature of the substrate is controlled and maintained at a predetermined fixed temperature of 400° C. The film was then annealed, as shown in step 18, in reducing gas (e.g. forming gas) at 450° C., 600° C., and 800° C. for 30 minutes, and then patterned with Al dots for capacitance measurements. FIG. 2 shows that the as-deposited film exhibits an unpinned C-V curve. The effective positive charge at the interface is approximately $1 \times 10^{12}$ cm$^{-2}$ before annealing. After annealing at 450° C. and 600° C., the positive charge at the interface is reduced to $5 \times 10^{10}$ cm$^{-2}$ and $8 \times 10^{10}$ cm$^{-2}$, respectively. However, the capacitor annealed at 800° C. shows a nearly flat C-V curve, suggesting increased interface states.

Figure 3:
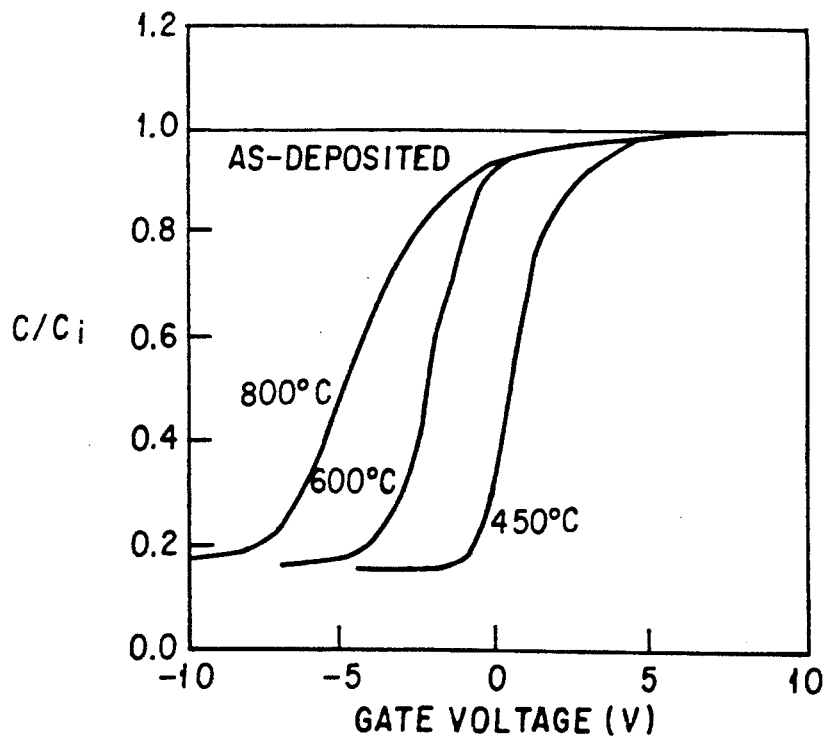
FIG. 3 is a plot of the capacitance-voltage characteristics of capacitors fabricated using $CaF_2$ deposited on silicon at 800° C.

In a second preferred embodiment process of the present invention, B-type $CaF_2$ films were epitaxially deposited onto (111)Si substrates according to the process flow of FIG. 1. A (111)Si substrate is cleaned in step 10 prior to $CaF_2$ deposition by annealing the substrate in an MBE chamber at 950° C. for 10 minutes, plus another 10 minutes with a Si flux equivalent to a deposition rate of 0.01 monolayer/sec, for example. In step 12, reflection high-energy electron diffraction (RHEED) and Auger spectroscopy, for example, are used to characterize the cleaning process. In step 14, $CaF_2$ is deposited onto the (111)Si substrate surface by molecular beam epitaxy (MBE) from an effusion cell with a deposition rate of 4 nm/min and to a film thickness of 100 nm. As shown in step 16, the temperature of the substrate is controlled and maintained at a predetermined fixed temperature of 800° C. The film was annealed, as shown in step 18, in forming gas (10% $H_2$ in $N_2$) at 450° C., 600° C., and 800° C. for 30 minutes, and then patterned with Al dots for capacitance measurements. FIG. 3 shows that the as-deposited film exhibits a pinned C-V curve, suggesting an unacceptable amount of interface states. However, after annealing, the positive interface charge is reduced to $1.7 \times 10^{11}$ $cm^{-2}$, $6.9 \times 10^{11}$ $cm^{-2}$, and $1.2 \times 10^{12}$ $cm^{-2}$ for annealing temperatures of 450° C., 600° C., and 800° C., respectively. Improved C-V characteristics are also observed when $CaF_2$ films are annealed in $F_2$ gas. However, the capacitors are not as stable as those annealed in hydrogen.

The pinning and unpinning of these capacitors may be caused by the dissociation of interfacial Ca-F-Si bonds during high temperature growth and the formation of a hydrogen or fluorine terminated Si interface after annealing in the $H_2$ or $F_2$. It is generally agreed that, for $CaF_2$ grown at high temperatures, the $CaF_2$/Si interface is predominantly Ca-Si bonds (see R. M. Tromp and M. C. Reuter, Physical Review Letters, 61, 1756 (1988), and J. L. Batstone and J. M. Phillips, Physical Review Letters, 61,2275 (1988), and J. Zegenhagen and J. R. Patel, Physical Review B, 41, 5315 (1990)). For the $CaF_2$ grown at low temperatures, more Si-F bonds exist. Recent studies also showed that F at the $SiO_2$/Si interface can suppress formation of interface states and improve the reliability of metal-oxide-semiconductor (MOS) devices (see Y. Nishioka, et. al, IEEE Electron Device Letters, 10 141 (1989)), implying that the existence of Si-F bonds is not the cause of interface state formation. Similar fluorine doping has also been applied to terminate dangling bonds at the heterojunction and in the SiC emitter of a heterojunction bipolar transistor (see T. Sugii, et. al, IEEE Transactions on Electron Devices, 37, 2331 (1990). These reports and the applicants' observation that good C-V characteristics can be obtained from $CaF_2$ films grown at low temperatures suggest that F atoms may passivate Si surfaces at low temperatures, and thus form a $CaF_2$/Si interface of low interface state density. During high-temperature growth or prolonged annealing in vacuum, these F atoms dissociate from the interfacial Ca-F-Si bonds and result in increased interface state density. When $CaF_2$/Si(111) is annealed in $H_2$ or $F_2$ at an appropriate temperature, H or F may terminate the dangling bonds of Si and/or Ca atoms and thus improve the C-V characteristics of the capacitors.

It should be noted that the inventive process of annealing the substrate on which the $CaF_2$ is deposited can also be done during and/or after the process of forming semiconductor devices on the substrate.

A few preferred embodiments have been described in detail hereinabove. It is to be understood that the scope of the invention also comprehends embodiments different from those described, yet within the scope of the claims.

Words of inclusion are to be interpreted as nonexhaustive in considering the scope of the invention.

While this invention has been described with reference to illustrative embodiments, this description is not intended to be construed in a limiting sense. In particular, the use of silicon in the (111) orientation in the description of the preferred embodiments is not intended to suggest that other orientations are excluded from the benefits of the invention. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for the growth of $CaF_2$ on a silicon surface, comprising the steps of:
    maintaining said silicon surface at an approximately fixed first temperature below approximately 500° C.;
    depositing $CaF_2$ on said surface; and
    annealing said $CaF_2$ on said silicon surface in reducing gas at a second temperature at or below approximately 600° C., whereby electric charge at the interface of said silicon surface and said $CaF_2$ is reduced.

2. The method of claim 1 wherein said approximately fixed temperature is 300° C.

3. The method of claim 1 wherein said depositing step is performed at the rate of approximately 4 nm/min.

4. The method of claim 1 wherein said $CaF_2$ is deposited to a thickness of 100 nm.

5. The method of claim 1 wherein said reducing gas is 10% $H_2$ in $N_2$.

6. The method of claim 1 wherein said second temperature is 450° C.

7. A method for the growth of $CaF_2$ on a silicon surface, comprising the steps of:
    maintaining said silicon surface at a first temperature below approximately 500° C.;
    starting a deposition of $CaF_2$ on said surface;
    ramping said first temperature to a second temperature over a first time period;
    maintaining said second temperature until said $CaF_2$ has deposited to a desired thickness;
    stopping said deposition; and
    annealing said $CaF_2$ on said silicon surface in reducing gas at a third temperature below approximately 600° C., whereby electric charge at the interface of said silicon surface and said $CaF_2$ is reduced.

8. The method of claim 7 wherein said first temperature is about 100° C.

9. The method of claim 7 wherein said second temperature is above about 600° C.

10. The method of claim 7 wherein said first time period is five minutes.

11. The method of claim 7 wherein said deposition occurs at the rate of 4 nm/min.

12. The method of claim 7 wherein said desired thickness is 100 nm.

13. The method of claim 7 wherein said reducing gas is 10% $H_2$ in $N_2$.

14. The method of claim 7 wherein said third temperature is 450° C.

15. A method for the growth of $CaF_2$ on a silicon surface, comprising the steps of:
    maintaining said silicon surface at an approximately fixed first temperature above approximately 500° C.;

depositing CaF$_2$ on said surface; and annealing said CaF$_2$ on said silicon surface in reducing gas at a second temperature at or below approximately 600° C., whereby electric charge at the interface of said silicon surface and said CaF$_2$ is reduced.

16. The method of claim 15 wherein said approximately fixed first temperature is between 500° C. and 800° C.

17. The method of claim 15 wherein said depositing step is performed at the rate of approximately 4 nm/min.

18. The method of claim 15 wherein said CaF$_2$ is deposited to a thickness of 100 nm.

19. The method of claim 15 wherein said reducing gas is 10% H$_2$ in N$_2$.

20. The method of claim 15 wherein said second temperature is 450° C.

* * * * *